(12) United States Patent
McLachlan et al.

(10) Patent No.: US 12,658,935 B2
(45) Date of Patent: Jun. 16, 2026

(54) DIGITAL-TO-ANALOG CONVERTER

(71) Applicant: Analog Devices International Unlimited Company, County Limerick (IE)

(72) Inventors: Roderick McLachlan, Edinburgh (GB); Ayan Das, Bengaluru (IN); Hrishikesh Ravi Mathukkarumukku, Bengaluru (IN)

(73) Assignee: Analog Devices International Unlimited Company, County Limerick (IE)

( * ) Notice: Subject to any disclaimer, the term of this patent is extended or adjusted under 35 U.S.C. 154(b) by 129 days.

(21) Appl. No.: 18/619,018

(22) Filed: Mar. 27, 2024

(65) Prior Publication Data

US 2025/0167795 A1     May 22, 2025

(30) Foreign Application Priority Data

Nov. 22, 2023    (IN) .............................. 202341079219

(51) Int. Cl.
*H03M 1/00* (2006.01)
*H03M 1/70* (2006.01)
(52) U.S. Cl.
CPC .................................... *H03M 1/70* (2013.01)
(58) Field of Classification Search
CPC ........... H03M 1/70; H03M 1/68; H03M 1/785
USPC ................................................. 341/144, 126
See application file for complete search history.

(56) References Cited

U.S. PATENT DOCUMENTS

| | | | | |
|---|---|---|---|---|
| 7,969,340 | B2 * | 6/2011 | Lou ...................... | H03M 7/3033 |
| | | | | 341/143 |
| 9,106,244 | B2 * | 8/2015 | Zhu .......................... | H03M 1/74 |
| 9,337,854 | B1 * | 5/2016 | Chen ................... | H03M 1/0673 |
| 9,735,799 | B1 * | 8/2017 | Nguyen .................. | H03M 1/06 |
| 10,326,469 | B1 * | 6/2019 | Cope ....................... | H03M 1/68 |
| 2006/0255992 | A1 * | 11/2006 | Sakiyama ............. | H03M 3/366 |
| | | | | 341/143 |
| 2008/0079619 | A1 * | 4/2008 | Sakurai ............... | H03M 1/0665 |
| | | | | 341/144 |
| 2017/0019118 | A1 * | 1/2017 | Zhu ...................... | H03M 1/0617 |
| 2020/0028519 | A1 * | 1/2020 | Hsiao .................... | H03M 1/067 |
| 2022/0200617 | A1 * | 6/2022 | Clara .................. | H03M 1/1014 |

OTHER PUBLICATIONS

Analog Devices, Dual-Current Output, Parallel Input, 16-/14-Bit Multiplying DACs with 4-Quadrant Resistors, Data Sheet: AD5547/AD5557, Rev D, Nov. 2012, 20 pages.
Analog Devices, Quad, Current-Output, Serial-Input 16-/14-Bit DACs, Data Sheet: AD5544/AD5554, Rev. H, Sep. 2015, 24 pages.
Analog Devices, Dual, Current-Output, Serial-Input, 16-/14-Bit DACs, Data Sheet: AD5545/AD5555, Rev I, Jan. 2016, 23 pages.

* cited by examiner

*Primary Examiner* — Jean B Jeanglaude
(74) *Attorney, Agent, or Firm* — Knobbe, Martens, Olson & Bear, LLP

(57) ABSTRACT

A method of controlling a digital-to-analog converter, DAC, system is disclosed. The DAC system includes a plurality of DAC cores connected in parallel with the outputs of the DAC cores coupled so as to provide a combined analog output. Each DAC core receives a digital signal which is a modified version of a digital input provided to the DAC system. By providing modified digital signals to the DAC cores and using a plurality of DAC cores, the monotonicity of the DAC system may be improved.

19 Claims, 9 Drawing Sheets

DIGITAL-TO-ANALOG CONVERTER

TECHNICAL FIELD

The present disclosure relates to a digital-to-analog converter, and in particular to a method of digital to analog conversion.

BACKGROUND

Digital-to-Analog Converters (DACs) may be susceptible to various errors that cause the relationship between input and output to be non-monotonic. Such a DAC may be considered non-monotonic, in that a change to the input does not cause a similar change in the output. Non-monotonicity can be problematic as it represents a reduction in how accurately the analog output represents the digital input.

There is therefore a desire to provide a DAC with improved monotonicity, such that a greater number of the bits of the DAC are monotonic and an analog output can be obtained with a better resolution.

SUMMARY

This invention presents a method for achieving monotonicity in high resolution DACs. Multiple identical DAC cores can be connected in parallel providing appropriate digital inputs in order to achieve better monotonicity than the individual cores. The method of deriving inputs to individual cores based on the digital input from the user is presented here. Additionally, the technique to take care of full-scale overflow is also discussed.

In particular, the system may supply a different digital signal to each of the multiple identical DAC cores, such that the output has an increased monotonicity compared to a system where all DAC cores receive the same input digital signal.

According to a first aspect of the invention, there is provided a method of digital-to-analog conversion, the method comprising: receiving a digital input at an input of a digital-to-analog converter, DAC, system, the DAC system configured to provide P bits of monotonicity; converting the digital input to an analog output, wherein converting the digital input to the analog output comprises: providing to each respective DAC core of a plurality of DAC cores a respective digital signal based on the digital input, wherein each DAC core of the plurality of DAC cores is an N bit DAC core and has M bits of monotonicity, wherein the plurality of DAC cores comprises $2^{P-M}$ DAC cores, and wherein when the respective digital signal has more than N bits, configuring a respective DAC core to receive an input with more than N bits; converting, using each of the plurality of DAC cores, the respective digital signal to a respective analog signal; and combining the respective analog signals output by each of the plurality of DAC cores to provide the analog output.

According to a second aspect of the invention, there is provided a digital-to-analog converter, DAC, system configured to implement the method, including receiving a digital input and outputting an analog output, the DAC system configured to provide P bits of monotonicity, the DAC system comprising: a plurality of DAC cores.

According to a third aspect of the invention, there is provided a method of digital-to-analog conversion, the method comprising: receiving a digital input at an input of a digital-to-analog converter, DAC, system, the DAC system configured to provide P bits of monotonicity; converting the digital input to an analog output, wherein converting the digital input to the analog output comprises: providing to each respective DAC core of a plurality of DAC cores a respective digital signal based on the digital input, wherein each DAC core of the plurality of DAC cores is an N bit DAC core and has M bits of monotonicity, wherein the plurality of DAC cores comprises $2^{P-M}$ DAC cores, and wherein all the DAC cores of the plurality of DAC cores is configured to support an overrange, wherein supporting an overrange comprises receiving an input with more bits than the DAC core is configured to accept; converting, using each of the plurality of DAC cores, the respective digital signal to a respective analog signal; combining the respective analog signals output by each of the plurality of DAC cores to provide the analog output.

According to a fourth aspect of the invention, there is provided a method of digital-to-analog conversion, the method comprising: receiving a digital input at an input of a digital-to-analog converter, DAC, system, the DAC system configured to provide P bits of monotonicity; converting the digital input to an analog output, wherein converting the digital input to the analog output comprises: providing to each respective DAC core of a plurality of DAC cores a respective digital signal based on the digital input, wherein each DAC core of the plurality of DAC cores is an N bit DAC core and has M bits of monotonicity, wherein the plurality of DAC cores comprises $2^{P-M}$ DAC cores; converting, using each of the plurality of DAC cores, the respective digital signal to a respective analog signal; combining the respective analog signals output by each of the plurality of DAC cores to provide the analog output; and if the respective DAC core would overflow when supplied with the respective digital signal, changing the connection of a termination leg of the respective DAC core from a first reference voltage to a second reference voltage.

BRIEF DESCRIPTION OF THE DRAWINGS

Aspects of the disclosure will now be described by way of example only and with reference to the accompanying drawings, wherein like reference numerals refer to like parts, and wherein.

DETAILED DESCRIPTION

A digital-to-analog converter (DAC) is a system that receives a digital input and converts the digital input to an analog signal. Ensuring that the analog output accurately represents the digital input is crucial to ensuring that downstream systems and components operate correctly and predictably.

A DAC may receive an N bit word as a digital input. Where the word is binary, the N bit word represents one of $2^N$ possible states or values. The DAC should therefore provide $2^N$ possible outputs. Ideally, the relationship between the input and the output of the DAC should be monotonic, such that the analog output increases as the digital input increases. This ensures that the analog output is a true representation of the digital input.

However, DACs may be susceptible to a number of errors that cause the relationship between input and output to not be monotonic. Such a DAC may be considered non-monotonic, as a change in the input does not cause a similar change in the output. Non-monotonicity may be problematic as it limits the minimum amount by which the analog output can be varied by varying the digital input. The greater the monotonicity of the system, the greater the resolution of the analog output.

A DAC may be specified to provide a number of bits of monotonicity. For example, a 24 bit DAC may provide 21 bits of monotonicity, indicating that changes in the 21 most significant bits of the DAC input are monotonic and that the three least significant bits of the DAC input are not monotonic. This means that the DAC accurately converts the 21 most significant bits of the digital input, such that varying the 21 MSBs of the digital input causes the analog output to vary in the same direction. Varying the three least significant bits of the input may not cause the output to vary in the expected direction.

Providing a DAC which has a greater number of monotonic bits results in a more accurate analog-to-digital conversion. However, increasing the monotonicity of the DAC can result in a complex circuit architecture with a higher silicon area or higher test cost due to trimming or calibration.

The present inventors have recognised that so as to improve the monotonicity of a digital-to-analog conversion, the outputs of multiple DACs can be combined in parallel. This provides higher monotonicity, lower noise and lower glitch energy. Each DAC may receive the same digital input signal, or may receive a modified version of the digital input signal. Further, the input provided to a DAC may be modified relative to the inputs provided to other DACs.

Figure 1:
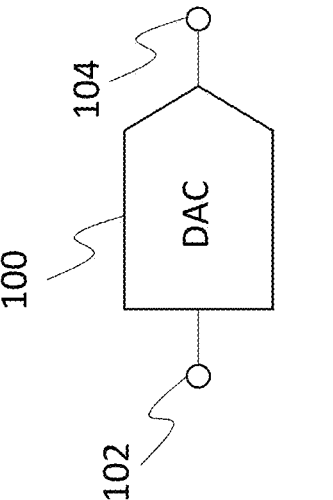
FIG. 1 shows a DAC core.

FIG. 1 shows a digital-to-analog converter, DAC, 100. The DAC 100 receives a digital input at an input node 102, converts the digital input to an analog signal, and outputs the analog signal to an output node 104.

The DAC 100 may be specified or configured to convert a digital input or word up to N bits long. Where the DAC 100 is a binary DAC, the N bit digital signal may represent $2^N$ possible values. The analog output signal may be represented by $2^N$ different amplitudes, such as voltages or currents depending on whether the DAC is a voltage DAC or a current DAC.

The DAC 100 may be capable of providing M bits of monotonicity. If the DAC 100 is completely monotonic, then M and N are the same number and the output of the DAC is monotonically related to the input. If the DAC 100 is not completely monotonic, then M is less than N.

For example, where the DAC 100 is a 24-bit DAC (N=24), and the DAC provides 21 bits of monotonicity (M=21), then the DAC can convert the 21 most significant bits (MSBs) of the input in a monotonic fashion. Changes in the 3 least significant bits (LSBs) of the DAC input may cause non-monotonic changes in the output of the DAC.

This may mean that where the 3 LSBs of the DAC input increase in value, the output may not increase in value, but may instead decrease.

To improve monotonicity, multiple DAC cores may be configured in parallel.

Figure 2:
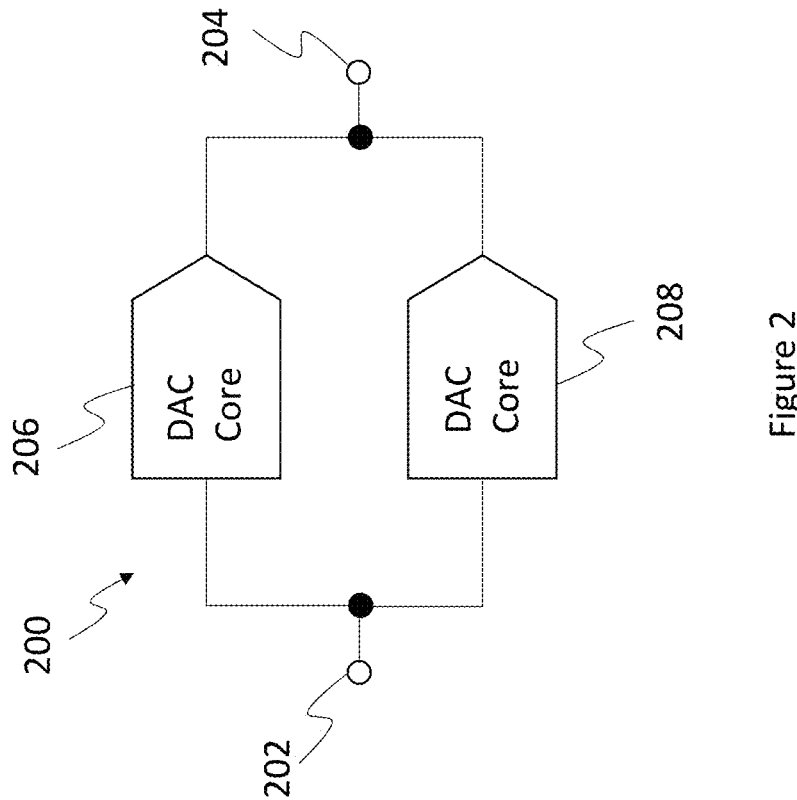
FIG. 2 shows two DAC cores coupled in parallel.

FIG. 2 shows a DAC 200 comprising a first DAC core 206 and a second DAC core 208. The first 206 and second 208 DAC cores may be the same type of DAC core. For example, they may be constructed using the same technology or process and be specified to the same levels of monotonicity. The first DAC core 206 and second DAC core 208 are both coupled to the same input 202, and therefore receive the same digital input. Further, the outputs of the first DAC core 206 and second DAC core 208 are coupled together and output via the same analog output node 204. As such, the first DAC core 206 and the second DAC core 208 may be considered to be coupled in parallel.

Due to process variations and manufacturing tolerances, the errors produced by the first DAC core 206 and the second DAC core 208 may be different. Coupling the outputs of the DAC cores together results in the analog output signal being the average of the respective outputs of both DAC cores. This allows the errors of the first DAC core 206 and the second DAC core 208 to be averaged out, reducing the errors included in the analog output and the effects of process variations in the DAC cores.

Whilst two DAC cores are shown in the DAC 200, further DAC cores may be connected to the input 202 and the output 204, for example 4, 8, 16, 32 etc. The number of DAC cores may be any power of 2. DAC cores may be coupled in parallel between the input and the output of the DAC system 200. The greater the number of DAC cores coupled in parallel in the DAC 200, the greater the reduction in errors included in the analog output and the better the performance of the DAC 200.

The inventers have discovered that monotonicity of the combined DAC can be improved over individual cores by generating a suitable digital signal for each core based on the input digital code. Each digital signal provided to each DAC core may be a modified version of the digital signal.

Figure 3:
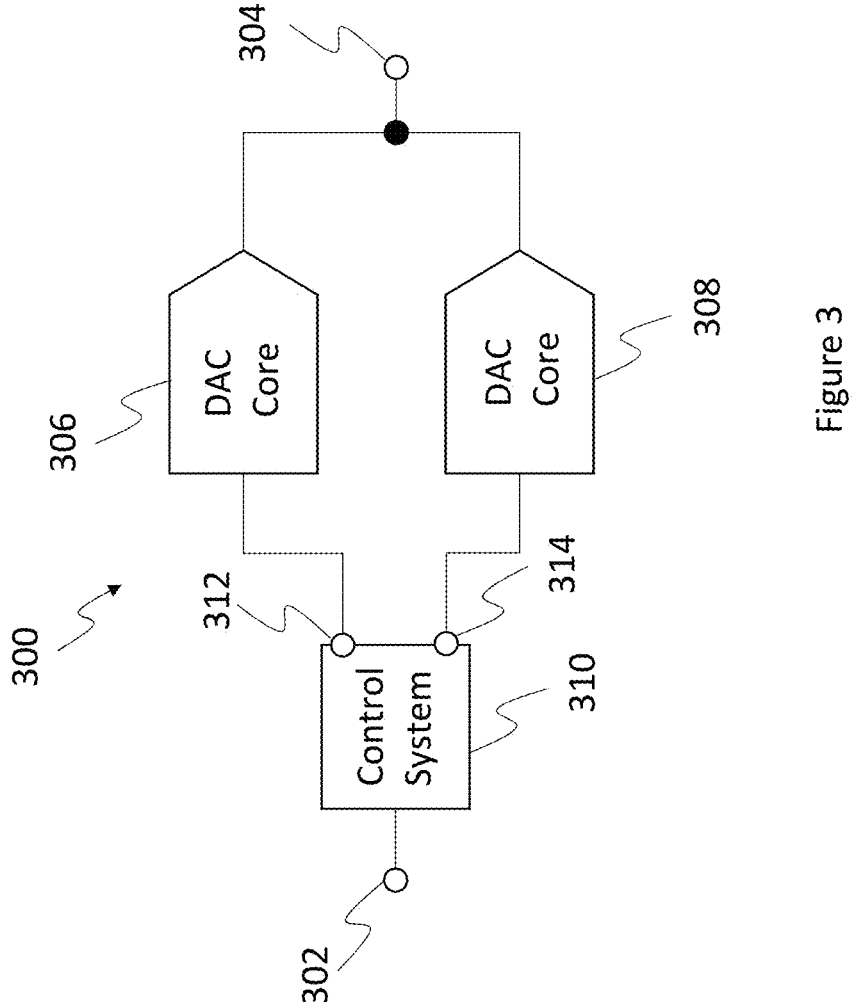
FIG. 3 shows two DAC cores coupled in parallel, with the inputs to the DAC cores provided by a control system in accordance with an example of the present disclosure.

FIG. 3 shows a digital to analog converter system 300 including two DAC cores 306, 308 connected in parallel. A digital input is received by the DAC system at input node 302. The digital input is provided to a DAC control system 310. The DAC control system 310 is configured to provide each DAC core 306, 308, with a respective digital signal based on the received digital input. The first DAC core 306 receives a first digital signal from a first output 312 of the control system 310 and the second DAC core 308 receives a second digital signal from a second output 314 of the control system 310.

The first DAC core 306 converts the first digital signal to a first analog signal. The second DAC core 308 converts the second digital signal to a second analog signal. The outputs of the first DAC core 306 and the second DAC core 308 are coupled together such that the first analog signal and the second analog signal are combined, resulting in an analog output signal being provided at the output node 304. The output impedances of the DAC cores 306, 308 may be such that by connecting the outputs of the plurality of DAC cores, the analog output of the DAC converter system is an average of the outputs of the plurality of DAC cores. For example, all the DAC cores may have the same output impedance. The DAC cores may be operated separately. For example, the DAC cores may be capable of receiving different input signals.

The digital signals provided to each DAC core may be chosen based on knowledge of the number of bits of monotonicity provided by each DAC core, the desired number of bits of monotonicity of the system and the number of DAC cores.

Whilst FIG. 3 includes two DAC cores 306, 308, further DAC cores may be used.

Figure 4:
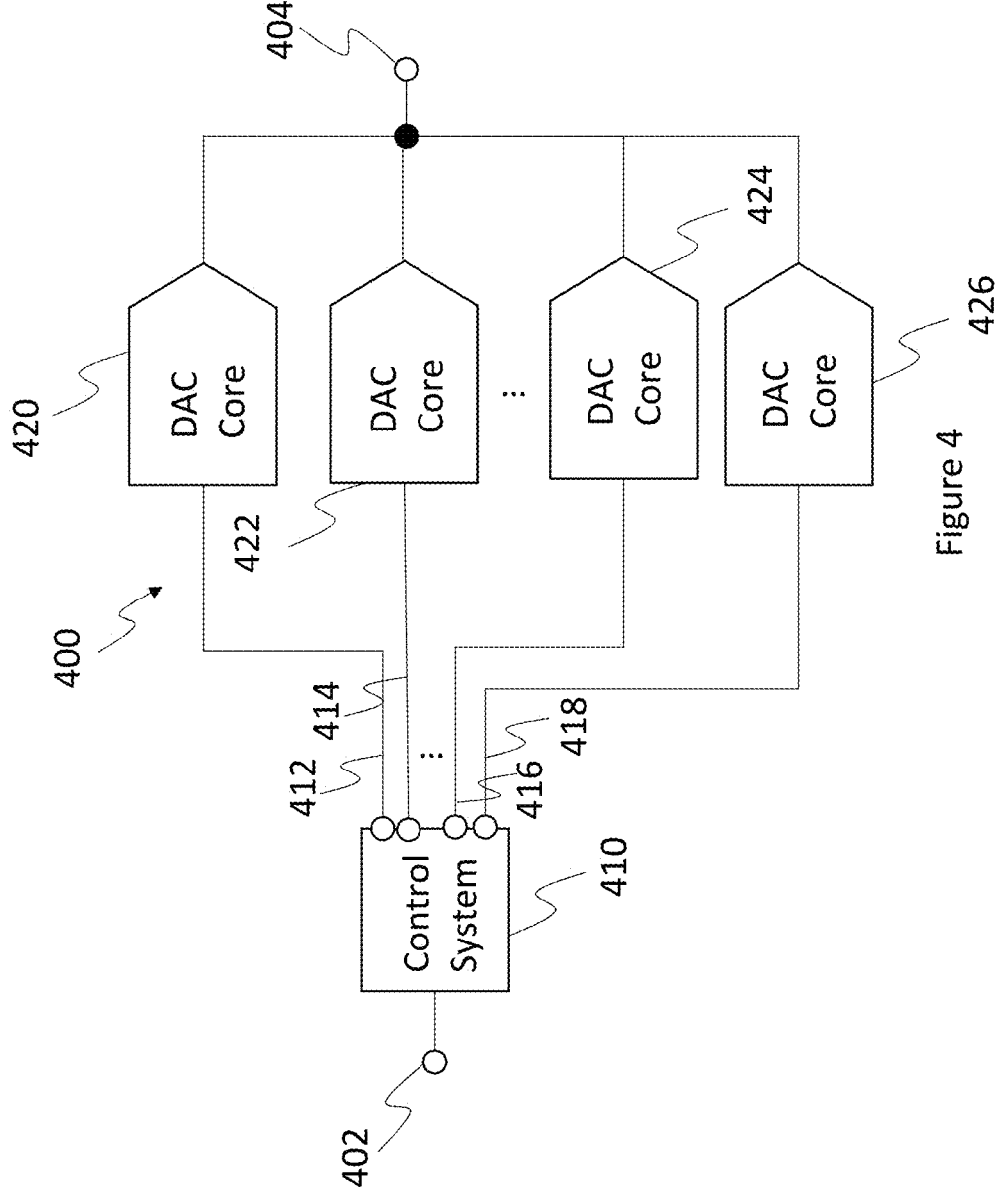
FIG. 4 shows a plurality of DAC cores coupled in parallel in accordance with an example of the present disclosure.

FIG. 4 shows a DAC system 400 including a plurality of DAC cores. FIG. 4 shows four DAC cores however there may be more DAC cores or less DAC cores. The number of DAC cores in the system may be chosen in dependence on the desired number of bits of monotonicity of the DAC system 400. A greater number of DAC cores may be used where the desired improvement in monotonicity is greater. As such, the system may comprise i DAC cores.

The DAC cores may be R-2R DAC cores, capacitive DAC cores, or current steering DAC cores. Other types of DAC core may also be used.

Figure 5:
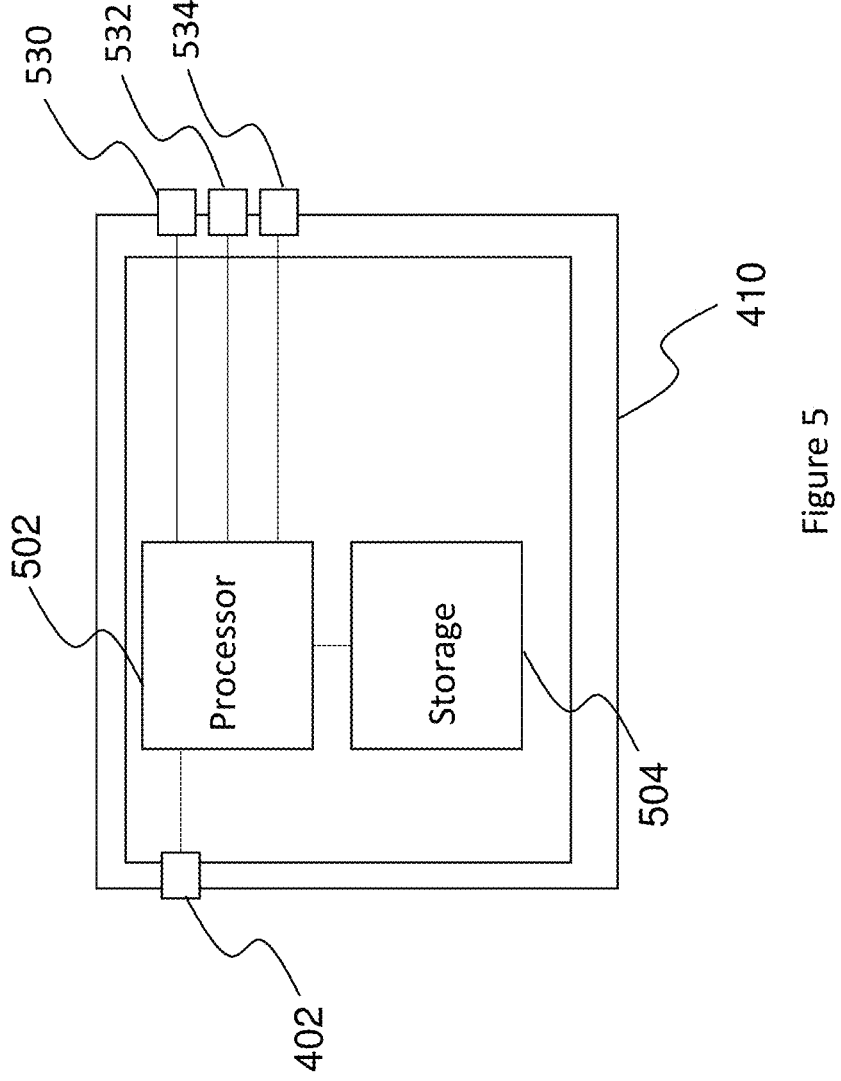
FIG. 5 shows a control system in accordance with an example of the present disclosure.

FIG. 5 shows a view of the control system 410. Control system 410 may include one or more processors 502. The processor 502 is be configured to receive an input at input node 402. The input comprises the digital input provided to the DAC system 400. The control system may include memory or storage 504. The control system 410 includes a plurality of outputs 530-534, each output configured to provide a respective digital signal to the input of a DAC core of a plurality of DAC cores.

In FIG. 4, the control system 410 receives a digital input at input node 402 and provides a respective digital signal to each of the DAC cores. The control system 410 provides i digital signals, with each digital signal being determined based on the digital input, the monotonicity of the DAC core. The first DAC core 420 receives a first digital signal 412 from the control system 410. The second DAC core 422 receives a second digital signal 414 from the control system 410. The third DAC core 424 receives a third digital signal 416 from the control system 410. The fourth DAC core 426 receives a fourth digital signal 418 from the control system 410. Each digital signal is provided at a respective output of the control system 410 and provided to the input of a respective one of the i DAC cores.

The DAC cores 420-426 included in the DAC system 400 may be the same type of DAC core. For example, they may be constructed using the same technology and additionally or alternatively be specified to the same level of accuracy or monotonicity.

All the DAC cores 420-426 have the same number of bits of monotonicity. Where each DAC core is an N bit DAC core (configured to receive an N bit input) the DAC core may have M bits of monotonicity, where M≤N. For a fully monotonic DAC core, M=N.

M=Number of bits of monotonicity of a DAC core
N=Number of bits of a DAC core

It is desirable to have a DAC system with a greater number of bits of monotonicity than a single DAC core. For example, a DAC system 400 which provides P bits of monotonicity, where P>M and P≤N.

P=Desired number of bits of monotonicity of the DAC system

This is achieved by using a plurality of DAC cores, each configured to provide a digital-to-analog conversion, rather than a single DAC core. Further, rather than supplying each DAC core with the same digital input signal, each DAC core may receive a respective digital signal. The number of DAC cores used in the DAC system 400 is related to the desired number of bits of monotonicity for the system compared to the number of bits of monotonicity provided by a single DAC core, as shown below:

Number of DAC cores=$2^{P-M}$

Figure 6:
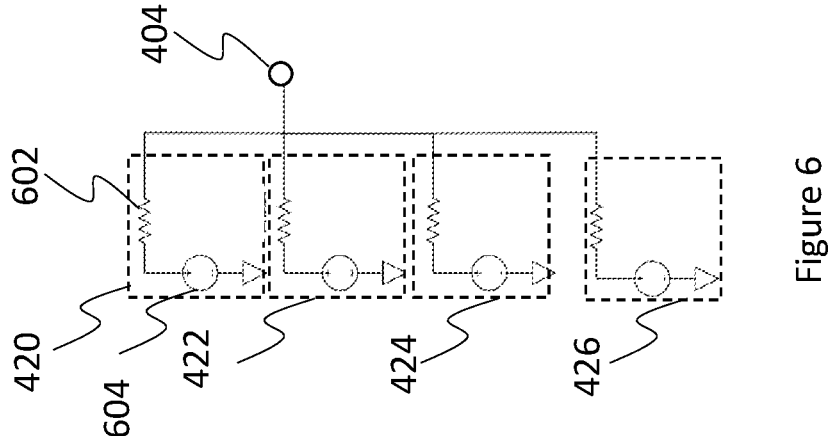
FIG. 6 shows a representation of the modelling of a plurality of DAC cores in accordance with an example of the present disclosure.

FIG. 6 shows a version of the DAC cores shown in FIG. 4. Each of the DAC cores 420-426 may be modelled as a voltage source in series with a resistor. For example, DAC core 420 is modelled using a resistor 602 and a voltage source 604. The voltage source 604 may generate a voltage Vdac. The resistor 602 represents the output resistance of the DAC core 602, having a resistance Rout.

The voltage source 604 generates a voltage Vdac=Vref*c/N, where Vref is the reference voltage of the DAC core 602 (not shown), c is the digital input signal to the DAC core and N=$2^n$, where n is the number of bits of the digital signal.

Each DAC core 420-426 is monotonic to a certain level, for example each DAC core has M bits of monotonicity. As such, small changes in the input code may not result in a monotonic change in the output of the DAC core. For example, each DAC core may be monotonic to increments of 4Δc. A 4Δc change in input code to a DAC core may change the analog output of the DAC system by ΔVdac. Any change in the input signal supplied to each DAC core that is smaller than 4Δc may result in a non-monotonic change in the DAC core output.

Assuming that the digital input to the DAC system changes by Δc, the input signal to each DAC core 420-426 would typically be changed by Δc (if the DAC cores were connected in the manner of FIG. 2, with the same input supplied to each DAC core). However, the output of each DAC core may not change monotonically in this situation, as the smallest increment that a DAC core is monotonic for is 4Δc.

As such, instead of incrementing the input signal to all the channels by Δc, instead the input signals to three of the four DAC cores (such as DAC cores 420-424) may remain unchanged, and the input to one of the four DAC cores (such as DAC core 426) may be incremented by 4Δc. This change in the input to the DAC core 426 results in a monotonic change in the output of the DAC core 426. When the outputs of the DAC cores 420-426 are added at output node 404, due to the averaging provided by the connections of the outputs of the DAC cores, this 4Δc in the input of one DAC core has the same effect on the output at node 404 as a Δc in the input of all of the DAC cores, whilst providing monotonicity for those bits of change.

As such, providing four DAC cores 420-426 in parallel in this manner, whilst changing the digital signals supplied to each of the DAC cores, allows the system to operate with greater monotonicity.

P-M may be considered to be the number of additional bits of monotonicity that the DAC system has compared to that of a single DAC core. Therefore, if the DAC system is designed to add 1 bit of monotonicity, $2^1$=2 DAC cores are required. If the DAC system is designed to add 2 bits of monotonicity, $2^2$=4 DAC cores are required. For the purpose of understanding, the DAC cores may be numbered i=0 to $2^{P-M}-1$.

The digital signals provided to each DAC core are modified such that the signals are incremented by a value which the DAC core can monotonically convert, with the average change in the digital signals being the same as the change in the digital input. Put another way, the average of the digital signals provided to the DAC cores is the same as the digital input to the DAC system. An adjustment value—the smallest the digital signal to a DAC core is incremented by— chosen to be $2^{N-M}$, as $2^{N-M}$ is the minimum input the DAC cores can convert monotonically, since they are M bit monotonic DAC cores.

Figure 7:
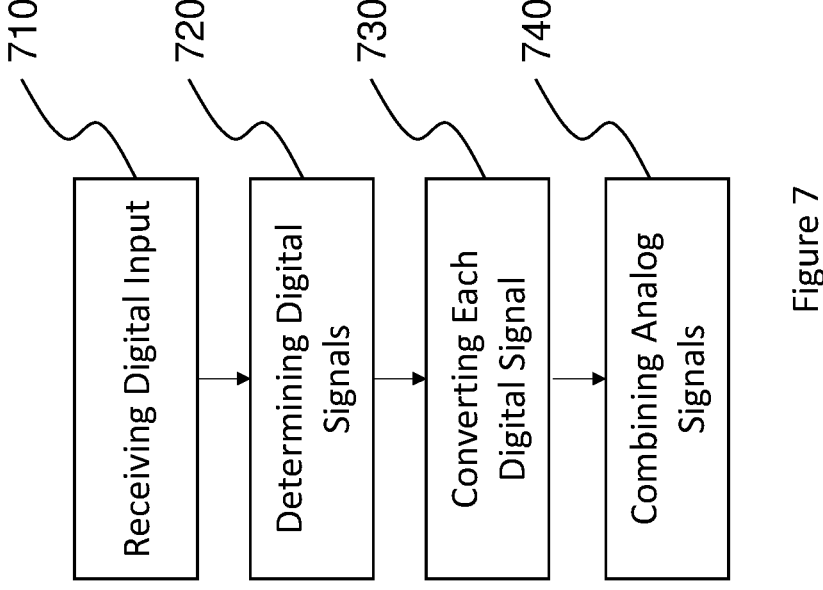
FIG. 7 shows a method of digital-to-analog conversion in accordance with an example of the present disclosure.

FIG. 7 outlines a method 700 which may be performed by the DAC system 400 of FIG. 4, or a method for controlling a DAC system 400. In step 710, the DAC system 400 receives a digital input at an input 402 of the DAC system 400. The digital input is provided to the control system 410 at input 402 of the control system 410.

In step 720, the control system 410 determines a plurality of digital signals, generating these digital signals and providing each to a respective DAC core of the plurality of DAC cores. The control system 410 generates a plurality of digital signals. Each digital signal is generated based on the digital input of the DAC system and provided to a respective DAC core of the plurality of DAC cores. The digital signals are generated such that each digital signal includes bits which can be monotonically converted by a DAC core, and such that an average of the digital signals is the same as the value of the digital input. Put another way, each DAC core has an adjustment value, and the adjustment values for the DAC cores have an average value equal to the [(N-1-M): (N-P)] bits of the digital input.

The digital input of the DAC system is N bits long, with the bits of the digital input are numbered bits [N-1:0].

Digital Input=[N-1 N-2 . . . 2 1 0]

The respective digital signal provided to each DAC core may comprise two parts, a first binary signal and an adjustment value.

A single DAC core will accurately convert the M most significant bits of the digital input to a monotonic analog output, as each DAC core is monotonic for the M MSBs of the digital input. The first binary signal therefore comprises the M most significant bits of the input concatenated with P-M bits, where the P-M bits are 0. These P-M bits are the bits of the digital input that the system wants to make monotonic. The first binary signal is the same for all DAC cores, based on the knowledge that all DAC cores can accurately, or monotonically, convert these M most significant bits.

If the aim of the DAC system is to provide an output which is not fully monotonic, such that N-1-P≥0, the first binary signal further comprises the concatenation of bits [N-1-P:0] of the digital input.

Put another way, the first binary signal is the digital input with the first N-P non-monotonic MSBs set to zero.

The adjustment value is different for each DAC core such that the averaged output has better resolution. The adjustment value provided in each digital signal is therefore different depending on the DAC they are supplied to. The adjustment value for each DAC core is different and takes a value of either 0 or $2^{N-M}$. As noted, the plurality of DAC cores are numbered $i=[2^{P-M}-1:0]$. If the value of the [(N-1-M):(N-P)] bits of the digital input are greater than i, the adjustment value for the $i^{th}$ DAC core is $2^{N-M}$. If the value of the [(N-1-M):(N-P)] bits of the digital input are less than or equal to i, the adjustment value for the $i^{th}$ DAC core is 0.

The adjustment value is chosen to be $2^{N-M}$, as $2^{N-M}$ is the minimum input the DAC cores can convert monotonically, since they are M bit monotonic DAC cores. For example, assuming the input to the combined DAC system changes by $2^{N-M-1}$, the inputs of half of the DAC cores are changed by $2^{N-M}$, keeping the inputs of other DAC cores unchanged (effectively, adding an adjustment value of 0). Then the averaged analog output changes corresponding to an input code change of $2^{N-M-1}$. This way, the combined DAC system can change its output monotonically by half the amount.

To form the digital signal for each respective DAC core, the adjustment value is added to the first binary signal.

Once the plurality of digital signals have been generated by the control system 410, they are provided to the plurality of DAC cores.

In step 730, each DAC core of the plurality of DAC cores converts the respective received digital signal to a respective analog signal.

In step 740, the analog signals output by each of the DAC cores are combined to provide an analog output at output node 404 of the DAC system As an example of how the digital signals are generated, a DAC core may be a 10 bit DAC core (N=10) with 6 bits of monotonicity per DAC core (M=6). As such, the four least significant bits (N-M) of the DAC core are non-monotonic. It may be desirable to provide a DAC system with 8 bits of monotonicity (P=8) rather than the 6 bits of monotonicity provided by a single DAC core. This is an increase of 2 bits (P-M) of monotonicity.

The DAC system may comprise a plurality of DAC cores related to the number of bits of monotonicity that the DAC system adds compared to the number of bits of monotonicity of a single DAC core. As 2 bits of monotonicity are required to be added to the DAC system 400, the system needs 4 ($2^{P-M}$) DAC cores-DAC cores 420-426. The DAC cores are in parallel, with the outputs of the DAC cores coupled together and each DAC core receiving a respective digital signal. The DAC cores may be labelled as DAC core 0, DAC core 1, DAC core 2, and DAC core 3.

The digital input to the DAC system 400, provided to input node 402 is a 10 bit digital input signal. For example, the digital input may be:

1101011001

The bits of the digital input are labelled bits [N-1:0]. In this case bits [9:0]:

| Bit Number | 9 | 8 | 7 | 6 | 5 | 4 | 3 | 2 | 1 | 0 |
|---|---|---|---|---|---|---|---|---|---|---|
| Digital Input | 1 | 1 | 0 | 1 | 0 | 1 | 1 | 0 | 0 | 1 |

The first binary signal is the same for all DAC cores:

The M most significant bits of the digital input are bits [N-1:N-M], or bits [9:4] of the digital input: 110101

This value is concatenated with P-M bits, where the bits are set as zero—00.

The aim is not to make the DAC system completely monotonic, but rather make the first 8 most significant bits monotonic-therefore N-1-P≥0, as 10-1-8=1. Therefore, the first binary signal also comprises a concatenation with bits [N-1-P:0] of the digital input, or bits [1:0] of the digital input—01.

This provides a first binary signal which is the concatenation of 110101, 00 and 01. The first binary signal is therefore 1101010001. This binary signal is the same for all DAC cores.

First binary signal=1101010001

The adjustment value is different for each DAC core. There are four DAC cores, labelled i=0, i=1, i=2 and i=3. The adjustment value is either 0 or $2^{N-M}$, for this example, the adjustment value is therefore 0 or $2^4$=16.

The [(N-1-M):(N-P)] bits of the digital input, the [3:2] bits of the digital input, are 10 in binary, or 2 in decimal. The value of these bits are used to determine the adjustment value for each DAC core.

For the i=0 DAC core, the [3:2] bits of the digital input are greater than i=0, as 2>0, so the adjustment value is 16 in decimal. The digital signal for the i=0 DAC core is therefore the first binary signal +16.

Digital signal for DAC core 0=1101010001+16=1101100001

For the i=1 DAC core, 2≥1, so the adjustment value is 16 in decimal. The digital signal for the i=1 DAC core is therefore the first binary signal +16.

Digital signal for DAC core 1=1101010001+16=1101100001

For the i=2 DAC core, 2≥2, so the adjustment value is 0 in decimal. The digital signal for the i=2 DAC core is therefore the first binary signal.

Digital signal for DAC core 2=1101010001

For the i=3 DAC core, 2≥3, so the adjustment value is 0 in decimal. The digital signal for the i=3 DAC core is therefore the first binary signal.

Digital signal for DAC core 3=1101010001

These digital signals are supplied to the inputs of the respective DAC cores.

By doing this, the system can monotonically convert the first 8 bits of the digital signal.

In the above example, no overflow occurs, in that the DAC cores are capable of converting the N bits supplied to them. However, in some cases, the use of an adjustment value may cause the digital signal provided to a DAC to overflow. For example, where the digital input is all "1's", the adjustment value may cause an overflow. This occurs for $2-M$ codes near full scale.

For example, taking a digital input of $2^N-1$:

Digital Input=1111111111

Taking each DAC core to be a 10 bit DAC core (N=10) with 6 bits of monotonicity per DAC core (M=6) and taking the desired DAC system monotonicity to be 8 bits of monotonicity (P=8), the first binary signal is:

First Binary Signal=1111110011

The [(N-1-M):(N-P)] bits of the digital input ([3:2] bits of the digital input), are 11 in binary, or 3 in decimal. In this situation, the adjustment value for DAC i=0 is $2^4$=16.

This results in a digital signal for DAC i=0 being 1111110011+16=

Digital Signal=10000000011

This digital signal provided to DAC core i has overflowed, in that it is longer than N bits or longer than the digital input. As such, the output of the DAC may not represent a true conversion of the digital signal provided to the DAC core.

Where the combination of a first binary signal and adjustment value would cause the digital signal to be longer than N bits, an alternative adjustment value and binary signal may be used.

The first binary signal is set to be the M most significant bits of the digital input concatenated with N-M bits set to zero. Taking the above example, where the digital Input=1111111111, the first binary signal is:

First Binary Signal=1111110000

Further, rather than the adjustment value being $2^{N-M}$, the adjustment value is set to an alternative adjustment value of $2^{N-M}-1$.

In the above example, the alternative adjustment value is $2^4-1$=15. This results in a digital signal for DAC i being 1111110000+15=

Digital Signal=1111111111

This prevents the digital signal from overflowing, such that it is N bits long. To compensate for the change in value of the digital signal, the DAC core may be modified.

Figure 8:
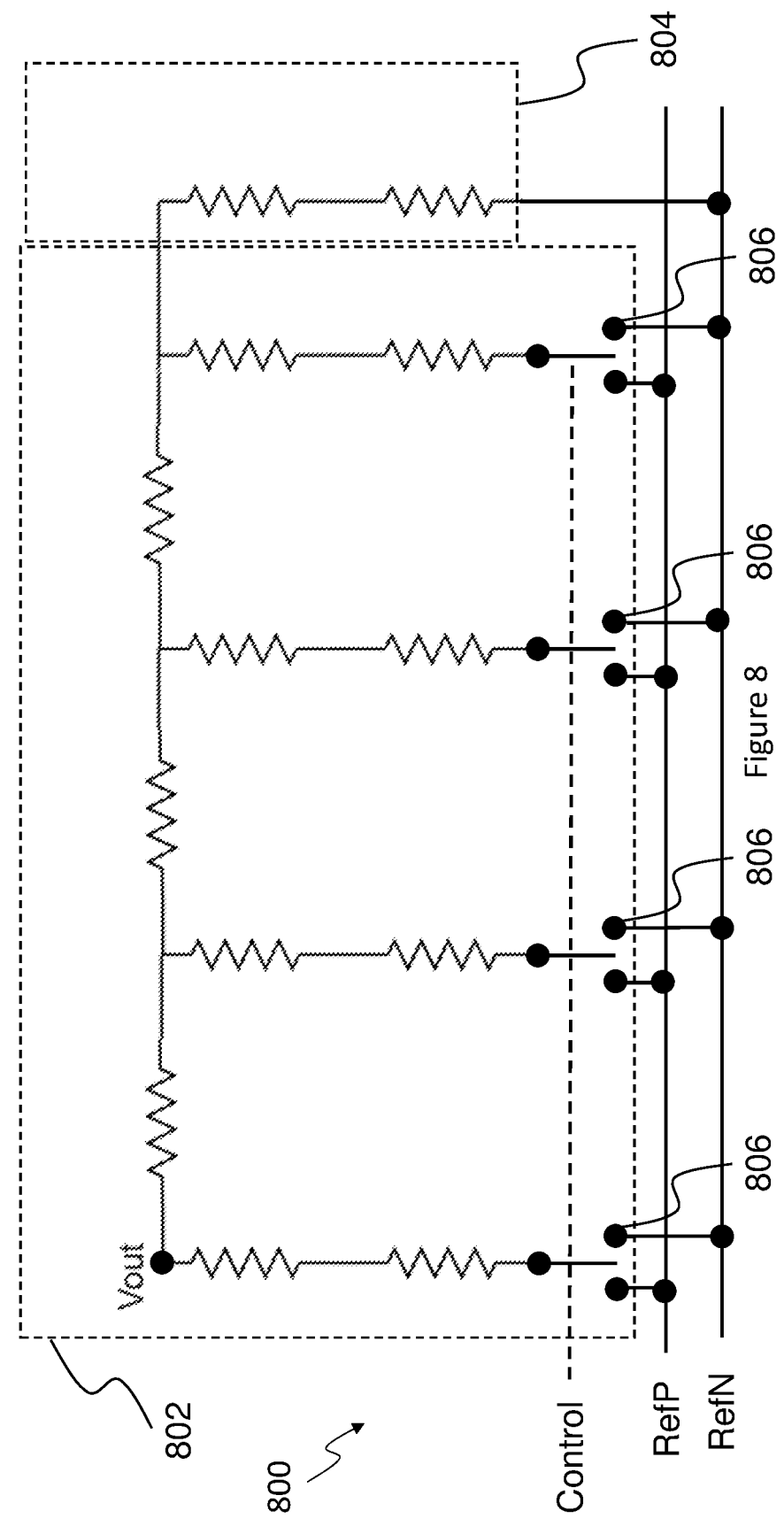
FIG. 8 shows an R-2R DAC with a termination leg.

FIG. 8 shows an example of a typical R-2R DAC core, including switching legs 802 and a termination leg 804. This DAC core may be used in place of the DAC cores of the preceding figures. The termination leg is coupled or directly connected to a reference voltage. In a typical R-2R layout, this termination leg 804 is always connected to a low reference voltage, sometimes called Ref-N, or ground. A number of switches 806 are controlled by a control signal and switchably coupled to two different reference voltages-indicated in FIG. 8 as RefN and RefP. Depending on the input digital signal to a DAC core, the control signal will change the coupling of the switching legs of the main section 802 of the DAC core between RefN and RefP. This results in a change in the output voltage at the output node. The operation of R-2R DAC cores would be understood by a person skilled in the art, and therefore will not be described in detail here.

Figure 9:
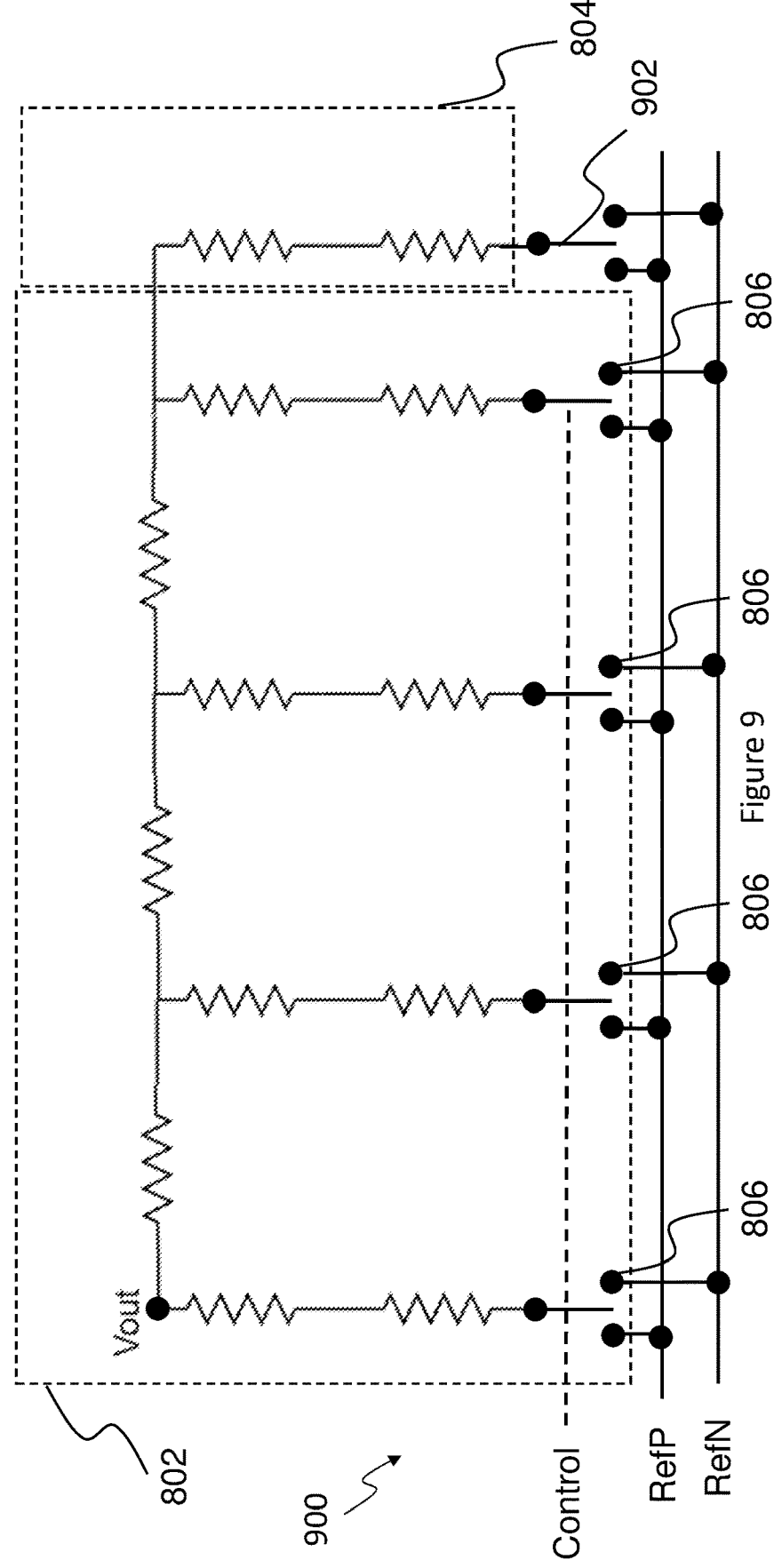
FIG. 9 shows an R-2R DAC with a modified termination leg in accordance with an example of the present disclosure

FIG. 9 shows an example of a modified R-2R DAC core 900 which is capable of receiving or configured to receiving an input which is equal to N+1. where N is the length of the digital word which the typical DAC core shown in FIG. 8 is configured or designed to receive. The termination leg 804 shown in FIG. 9 is not directly coupled to the low reference voltage, but is instead coupled to both the low reference voltage RefN and the high reference voltage RefP by a switch 902. This switch 902 may be controlled by a termination leg control signal.

As such, the termination leg is configured to be coupled to either a low reference voltage or a high reference voltage depending on the termination leg control signal. The high reference voltage may be a voltage supply rail, or a positive voltage.

The R-2R DAC 900 shown in FIG. 9 may be used in place of each of the respective DAC cores of the DAC system.

When the DAC core overflows, the termination leg 804 coupling is switched from the low reference voltage to the high reference voltage. This termination leg 804 may be considered to have a value equal to one bit, or any other bit value, and therefore modifying its connection results in a greater value at the output Vout.

By switching the termination leg of the DAC when an overflow would occur, the DAC core can be configured to mitigate the full-scale overflow without losing monotonicity. When the combination of the adjustment value and first binary signal would result in a digital signal longer than N bits, the alternative adjustment value of $2^{N-M}-1$ is used and the alternative first binary signal is used. Further, the termination leg of the respective DAC core is connected to the high reference voltage, or Ref-P. We changed the adjustment value to $2^{N-M}-1$ because the termination leg may be considered to have a weight or value equal to 1. The DAC may be implemented such that the termination leg is considered to have a different value. In this situation, if the DAC is implemented such that the weight of the termination leg is considered to be a higher power of two, e.g. $2^t$, the adjustment value would be $2^{N-M}-2^t$.

Therefore, as an example, to implement a digital input of 1111111100, we have 3 DAC cores with input 1111111111. Termination leg of these DACs are connected to a first reference voltage (Ref-P). The input to the $4^{th}$ DAC is 1111110000, with termination leg connected to a second reference voltage (Ref-N).

Using the alternative first binary signal means that the final two bits of the digital input ("11" in the above example) which are not included in the binary signal due to the change in how the binary signal is created, may also optionally be considered in a second stage. The final two bits in this example represent the bits which will remain non-monotonic in the DAC system. In some cases, where the aim is to create a fully monotonic DAC system, there will not be any further bits to consider, and this stage may therefore be optional. Alternatively, as these bits may have a non-monotonic impact on the output, they may be neglected. Taking into account the additional bits in the second stage can be done in multiple ways since the DAC is not expected to be monotonic for these bit transitions. For example, the input to one of the DACs which receives an adjustment value of 0 may be increased by $2^{P-M}$ multiplied by the value of the final bits which were not included in the adjusted binary signal.

Whilst the DAC of FIG. 9 shows an R-2R DAC core. Other DAC cores may be used, such as a capacitive DAC core or current steering DAC core. The DAC cores may be chosen such that they are capable of supporting an overrange or overflow of an input to the DAC core, such that the DAC core can receive or convert more than N bits.

Various modifications whether by way of addition, deletion, or substitution of features may be made to the above described examples to provide further examples, any and all of which are intended to be encompassed by the appended claims.

Numbered Aspects

By way of non-limiting example, some aspects of the disclosure are set out in the following numbered clauses.

1. A method of digital-to-analog conversion, the method comprising:
   receiving a digital input at an input of a digital-to-analog converter, DAC, system, the DAC system configured to provide P bits of monotonicity;
   converting the digital input to an analog output, wherein converting the digital input to the analog output comprises:
      providing to each respective DAC core of a plurality of DAC cores a respective digital signal based on the digital input, wherein each DAC core of the plurality of DAC cores is an N bit DAC core and has M bits of monotonicity, wherein the plurality of DAC cores comprises $2^{P-M}$ DAC cores, and wherein when the respective digital signal has more than N bits, configuring a respective DAC core to receive an input with more than N bits;
   converting, using each of the plurality of DAC cores, the respective digital signal to a respective analog signal;
   combining the respective analog signals output by each of the plurality of DAC cores to provide the analog output.

2. The method according to aspect 1, wherein each DAC core of the plurality of DAC cores is configured to receive an input with more bits than the DAC core is programmed to accept.

3. The method according to aspect 1 or 2, wherein the respective digital signal provided to each respective DAC core of the plurality of DAC cores is formed by adding a first binary signal based on the digital input and an adjustment value.

4. The method according to aspect 3, wherein the first binary signal comprises the M most significant bits of the digital input.

5. The method according to aspect 4, wherein the first binary signal comprises the M most significant bits of the digital input, with the remaining bits of the digital input set to zero.

6. The method according to any of aspects 3-5, wherein the system adds P-M bits of monotonicity.

7. The method according to aspect 6, wherein an average of the respective adjustment values of the respective digital signals is the same as the value of the P-M bits for which monotonicity is added.

8. The method according to any of aspects 3-7, wherein the bits of the digital input are numbered bits [N-1:0], and wherein the first binary signal is obtained by concatenating:
   bits [N-1:N-M] of the digital input;
   P-M bits, wherein the bits are set as zero.

9. The method according to aspect 8, wherein, if N-1-P≥0, the first binary signal further comprises the concatenation of bits [N-1-P:0] of the digital input.

10. The method according to any of aspects 3-9, wherein the method further comprises obtaining the adjustment value, wherein the adjustment value is either 0 or $2^{N-M}$.

11. The method according to any of aspects 3-10, wherein the plurality of DAC cores are numbered i=[$2^{P-M}$-1:0], and wherein if the value of the [(N-1-M):(N-P)] bits of the digital input are greater than i, the adjustment value for the $i^{th}$ DAC core is $2^{N-M}$.

12. The method according to aspect 11, wherein if the value of the [(N-1-M):(N-P)] bits of the digital input are less than or equal to i, the adjustment value for the $i^{th}$ DAC core is 0.

13. The method according to any preceding aspect, further comprising configuring the or each respective DAC core such that it is capable of receiving $2^N$+1 input codes.

14. The method according to aspect 13, wherein the method further comprises connecting a termination leg of the DAC core to a reference voltage when the DAC overflows.

15. The method according to aspect 13, wherein, if the respective DAC core would overflow when supplied with the respective digital signal, the method further comprises changing the connection of a termination leg of the respective DAC core from a first reference voltage to a second reference voltage.

16. The method according to any of aspects 3-15, wherein if the addition of the first binary signal and the adjustment value would result in respective digital signal with a value greater than $2^N$-1, the method further comprises:
   modifying the first binary signal to be a concatenation of the M most significant bits of the digital input and N-M bits set to zero;
   modifying the adjustment value to be $2^{N-M}$-1, and
   changing the connection of a termination leg of the respective DAC core from a first reference voltage to a second reference voltage.

17. The method according to any preceding aspect, wherein combining the respective analog signals output by each of the plurality of DAC cores to provide the analog output comprises combining the analog signals such that each analog signal has an equal weight in the analog output.

18. The method according to any preceding aspect, wherein the adjustment values for the DAC cores have an average value equal to the [(N-1-M):(N-P)] bits of the digital input.

19. A digital-to-analog converter, DAC, system configured to implement the method according to any preceding aspect, receiving a digital input and outputting an analog output, the DAC system configured to provide P bits of monotonicity, the DAC system comprising:
   a plurality of DAC cores.

20. The DAC system according to aspect 19, wherein each DAC core of the plurality of DAC cores has an output impedance configured such that by connecting the outputs of the plurality of DAC cores, the analog output of the DAC converter system is an average of the outputs of the plurality of DAC cores.

21. The DAC system according to any of aspects 19 or 20, wherein the plurality of DAC cores are the same type of DAC core.

22. The DAC system according to any of aspects 19-21, wherein plurality of DAC cores are R-2R DAC cores.

23. The DAC system according to any of aspects 19-21, wherein the plurality of DAC cores are capacitive DAC cores.

24. The DAC system according to any of aspects 19-21, wherein the plurality of DAC cores are current steering DAC cores.

25. The DAC system according to any of aspects 19-24, wherein each of the DAC cores are configured to be operated separately.

26. A method of digital-to-analog conversion, the method comprising:

receiving a digital input at an input of a digital-to-analog converter, DAC, system, the DAC system configured to provide P bits of monotonicity;

converting the digital input to an analog output, wherein converting the digital input to the analog output comprises:

providing to each respective DAC core of a plurality of DAC cores a respective digital signal based on the digital input, wherein each DAC core of the plurality of DAC cores is an N bit DAC core and has M bits of monotonicity, wherein the plurality of DAC cores comprises $2^{P-M}$ DAC cores, and wherein all the DAC cores of the plurality of DAC cores is configured to support an overrange, wherein supporting an overrange comprises receiving an input with more bits than the DAC core is configured to accept;

converting, using each of the plurality of DAC cores, the respective digital signal to a respective analog signal;

combining the respective analog signals output by each of the plurality of DAC cores to provide the analog output.

27. A method of digital-to-analog conversion, the method comprising:

receiving a digital input at an input of a digital-to-analog converter, DAC, system, the DAC system configured to provide P bits of monotonicity;

converting the digital input to an analog output, wherein converting the digital input to the analog output comprises:

providing to each respective DAC core of a plurality of DAC cores a respective digital signal based on the digital input, wherein each DAC core of the plurality of DAC cores is an N bit DAC core and has M bits of monotonicity, wherein the plurality of DAC cores comprises $2^{P-M}$ DAC cores;

converting, using each of the plurality of DAC cores, the respective digital signal to a respective analog signal;

combining the respective analog signals output by each of the plurality of DAC cores to provide the analog output; and if the respective DAC core would overflow when supplied with the respective digital signal, changing the connection of a termination leg of the respective DAC core from a first reference voltage to a second reference voltage.

What is claimed is:

1. A method of digital-to-analog conversion, the method comprising:

receiving a digital input at an input of a digital-to-analog converter, DAC, system, the DAC system configured to provide P bits of monotonicity; and converting the digital input to an analog output, wherein converting the digital input to the analog output comprises:

providing to each respective DAC core of a plurality of DAC cores a respective digital signal based on the digital input, wherein each DAC core of the plurality of DAC cores is an N bit DAC core and has M bits of monotonicity, wherein the plurality of DAC cores comprises $2^{P-M}$ DAC cores;

configuring a DAC core of the plurality of DAC cores to receive the respective digital signal having more than N bits, wherein the respective digital signal received by the DAC core is different than the respective digital signal received by another DAC core of the plurality of DAC cores;

converting, using each of the plurality of DAC cores, the respective digital signal to a respective analog signal; and combining the respective analog signals output by each of the plurality of DAC cores to provide the analog output.

2. The method of claim 1, wherein each DAC core of the plurality of DAC cores is configured to receive an input with more bits than the DAC core is programmed to accept.

3. The method of claim 1, wherein the respective digital signal provided to each respective DAC core of the plurality of DAC cores is formed by adding a first binary signal based on the digital input and an adjustment value.

4. The method of claim 3, wherein the adjustment values for the DAC cores have an average value equal to the [(N-1-M):(N-P)] bits of the digital input.

5. The method of claim 3, wherein the first binary signal comprises the M most significant bits of the digital input.

6. The method of claim 5, wherein the first binary signal comprises the M most significant bits of the digital input, with the remaining bits of the digital input set to zero.

7. The method of claim 3, wherein the system adds P-M bits of monotonicity.

8. The method of claim 7, wherein an average of the respective adjustment values of the respective digital signals is the same as the value of the P-M bits for which monotonicity is added.

9. The method of claim 3, wherein the bits of the digital input are numbered bits [N-1:0], and wherein the first binary signal is obtained by concatenating:

bits [N-1:N-M] of the digital input; and

P-M bits, wherein the bits are set as zero.

10. The method of claim 9, wherein, if N-1-P≥0, the first binary signal further comprises the concatenation of bits [N-1-P:0] of the digital input.

11. The method of claim 3, wherein the method further comprises obtaining the adjustment value, wherein the adjustment value is either 0 or $2^{N-M}$.

12. The method of claim 3, wherein the plurality of DAC cores are numbered i=[$2^{P-M}$-1:0], and wherein if the value of the [(N-1-M):(N-P)] bits of the digital input are greater than i, the adjustment value for the $i^{th}$ DAC core is $2^{N-M}$.

13. The method of claim 12, wherein if the value of the [(N-1-M):(N-P)] bits of the digital input are less than or equal to i, the adjustment value for the $i^{th}$ DAC core is 0.

14. The method of claim 3, wherein if addition of the first binary signal and the adjustment value would result in respective digital signal with a value greater than $2^N-1$, the method further comprises:

modifying the first binary signal to be a concatenation of the M most significant bits of the digital input and N-M bits set to zero;

modifying the adjustment value to be $2^{N-M}-1$, and changing a connection of a termination leg of the respective DAC core from a first reference voltage to a second reference voltage.

15. The method of claim 1, further comprising configuring each respective DAC core such that it is capable of receiving $2^N+1$ input codes.

16. The method of claim 15, wherein the method further comprises connecting a termination leg of a respective DAC core to a reference voltage when the DAC overflows.

17. The method of claim 15, wherein, if the respective DAC core would overflow when supplied with the respective digital signal, the method further comprises changing a connection of a termination leg of the respective DAC core from a first reference voltage to a second reference voltage.

18. A method of digital-to-analog conversion, the method comprising:

receiving a digital input at an input of a digital-to-analog converter, DAC, system, the DAC system configured to provide P bits of monotonicity; and converting the digital input to an analog output, wherein converting the digital input to the analog output comprises:

providing to each respective DAC core of a plurality of DAC cores a respective digital signal based on the digital input, wherein each DAC core of the plurality of DAC cores is an N bit DAC core and has M bits of monotonicity, wherein the plurality of DAC cores comprises $2^{P-M}$ DAC cores, and wherein all the DAC cores of the plurality of DAC cores is configured to support an overrange, wherein supporting an overrange comprises receiving an input with more bits than the DAC core is configured to accept;

converting, using each of the plurality of DAC cores, the respective digital signal to a respective analog signal; and combining the respective analog signals output by each of the plurality of DAC cores to provide the analog output.

19. A method of digital-to-analog conversion, the method comprising:

receiving a digital input at an input of a digital-to-analog converter, DAC, system, the DAC system configured to provide P bits of monotonicity; and converting the digital input to an analog output, wherein converting the digital input to the analog output comprises:

providing to each respective DAC core of a plurality of DAC cores a respective digital signal based on the digital input, wherein each DAC core of the plurality of DAC cores is an N bit DAC core and has M bits of monotonicity, wherein the plurality of DAC cores comprises $2^{P-M}$ DAC cores;

converting, using each of the plurality of DAC cores, the respective digital signal to a respective analog signal;

combining the respective analog signals output by each of the plurality of DAC cores to provide the analog output; and changing a connection of a termination leg of a DAC core of the plurality of DAC cores from a first reference voltage to a second reference voltage.

\* \* \* \* \*